United States Patent [19]

Berger

[11] Patent Number: 4,871,955

[45] Date of Patent: Oct. 3, 1989

[54] SYSTEM FOR STRICTLY POSITIONING AN OBJECT ALONG AN AXIS

[75] Inventor: Laurent Berger, Mennecy, France

[73] Assignee: Micro-Controle, Evry, France

[21] Appl. No.: 241,865

[22] Filed: Sep. 8, 1988

[30] Foreign Application Priority Data

Sep. 8, 1987 [FR] France .............................. 87 12435

[51] Int. Cl.$^4$ .............................................. G05B 1/06
[52] U.S. Cl. .................................... 318/640; 318/577;
318/632; 250/201; 250/548
[58] Field of Search ............... 318/135, 646, 687, 653,
318/685, 632, 561–576, 617, 601, 603, 593, 594;
364/513, 490; 250/548, 563, 572, 201, 221, 561,
491.1; 356/400, 401

[56]  References Cited

U.S. PATENT DOCUMENTS

| | | | |
|---|---|---|---|
| 3,786,332 | 1/1974 | Hepner et al. | 318/640 X |
| 3,843,916 | 10/1974 | Trotel et al. | 318/640 |
| 3,866,212 | 2/1975 | Simon et al. | 318/625 X |
| 4,019,109 | 4/1977 | McCoy et al. | 318/687 X |
| 4,160,158 | 7/1979 | Vali | 318/577 X |
| 4,453,084 | 6/1984 | Brouwer | 318/577 X |
| 4,494,060 | 1/1985 | Chitayat et al. | 318/632 X |
| 4,631,416 | 12/1986 | Trutna, Jr. | 250/548 |
| 4,654,571 | 3/1987 | Hinds | 318/640 X |
| 4,687,980 | 8/1987 | Philips et al. | 250/201 X |
| 4,698,575 | 10/1987 | Bouwer | 318/640 |

OTHER PUBLICATIONS

Journal of Vac. Science & Technology, Vol. 19, No. 4 of Nov./Dec., 1981, pp. 1214 to 1218.
Solid State Technology, June, 1980, pp. 80 to 84, Proceedings of the Int'l Conf. on Microlithography, Sept. 30, etc. 1980, Microcircuit Engineering 80, pp. 181 to 191.

Primary Examiner—William M. Shoop, Jr.
Assistant Examiner—Paul Ip
Attorney, Agent, or Firm—Fisher, Christen & Sabol

[57]  ABSTRACT

This invention relates to a system for strictly positioning along an axis an object such as a wafer of semi-conducting material during a process of constructing integrated circuits, wherein it comprises:
  means for controlling the drive means for causing the carriage to make a displacement of acquisition of which the amplitude is at least equal to the step of the second optical grating;
  a generator generating, during said displacement of acquisition, a periodic reference signal, of period equal to the step of said second grating;
  multiplication means for forming the product of said period reference signal and of the signal actually delivered by said photoelectric sensor;
  means for summing the signal formed by the succession of said products;
  calculating means for determining the possible offset existing between said optical gratings; and
  means controlling the drive means to bring said optical gratings into strict alignment.

5 Claims, 2 Drawing Sheets

SYSTEM FOR STRICTLY POSITIONING AN OBJECT ALONG AN AXIS

The present invention relates to a system for strictly positioning an object along an axis. It is particularly, although not exclusively, adapted to be employed in machines for constructing integrated circuits, such as those called "photorepeaters".

Integrated circuits are known to be constructed in successive steps, in which defined zones of a wafer of semi-conducting material must be subjected to specific operations, such as masking, etching, metallization, diffusion, etc. In order that each of these operations be carried out in the corresponding zone and not in adjacent zones, it is obviously very important that the positioning of said wafer of semi-conducting material with respect to the machine be strict.

A system is already known, to that end, for strictly positioning an object such as a wafer of semi-conducting material, along an axis, said system comprising:

a carriage mobile in translation along said axis under the action of controlled drive means, said object being fixed to said carriage;

a first optical grating which is fixed, linear and periodic, and perpendicular to said axis;

a second optical grating, fast with said object, likewise linear and periodic, said object being fixed on said carriage so that said second optical grating is perpendicular to said axis and said first and second optical gratings being at least approximately optically aligned, when said carriage occupies a determined stop position;

a light source for illuminating said first optical grating; and a photoelectric sensor for picking up the light coming from said first and second optical gratings.

Such a system is intended for the fine adjustment of the positioning of the object along said axis and is generally used in combination with another positioning system (which will not be described as it does not form part of the present invention) providing a rough positioning, in particular for bringing said carriage into a stop position such that said first and second optical gratings are at least approximately aligned.

If, in this stop position of said carriage, the object is strictly positioned with respect to said axis (i.e. said first and second gratings are then exactly aligned) and if, from this stop position, a displacement is communicated to the carriage along said axis equal to one or more distribution steps of said bands of the gratings, the photoelectric sensor generates a periodic signal which may be considered as a reference signal. This reference signal has a frequency equal to the reverse of the step of said second grating.

On the other hand, if, in this stop position of said carriage, the object is not strictly positioned with respect to said axis (i.e. said first and second gratings are then not exactly aligned) and if, from this stop position of the carriage, the same displacement as before is communicated to the carriage, the photoelectric sensor delivers a periodic signal similar to said reference signal and of the same frequency, but phase-shifted with respect thereto. Such phase-shift then represents the offset between said first and second optical gratings and therefore the offset of said object with respect to its exact position.

Consequently, it may be envisaged to compare such a reference signal with the signal actually delivered by the photoelectric sensor in order to determine the offset of said object with respect to its exact position. However, the results which would be obtained would not be precise, as the signal delivered by the photoelectric sensor is affected by parasitic reflections, diffractions and diffusions coming in particular from the surface state of the semi-conducting wafer and the optical gratings.

It is an object of the present invention to provide a system of the type described hereinabove for strictly positioning an object.

To that end, according to the invention, the system of the type described hereinabove is noteworthy in that it comprises:

means for controlling the drive means for causing said carriage to make a displacement of acquisition with respect to said stop position, of which the amplitude is at least equal to the step of said second optical grating, then to take said carriage to said stop position;

means for generating, during said displacement of acquisition, a periodic reference signal, of period equal to the step of said second grating, synchronized with the displacement of said carriage, so a to correspond to the pure periodic signal which would be generated by said photoelectric sensor during the displacement of the carriage, if, in said stop position of the latter, said first and second optical gratings are strictly aligned and if no parasitic light is superposed on this periodic signal;

multiplication means for forming, at a plurality of successive instants of said preliminary displacement, the product of the corresponding values of said periodic reference signal and of the signal actually delivered by said photoelectric sensor during this preliminary displacement;

means for summing, over a duration at least equal to the step of said second grating, the signal formed by the succession of said products delivered by said multiplication means;

calculating means for determining, from the integrated signal delivered by said summing means, the possible offset existing between said first and second gratings when the carriage is in its initial position; and means controlling the drive means for causing said carriage to make, from said stop position, a displacement of correction of which the amplitude corresponds to said offset, in order to bring said first and second optical gratings into strict alignment.

Owing to the correlation made by the system according to the invention between said reference signal and the signal delivered by the sensor, the non-periodic parasitic light is thus eliminated, whilst making it possible to determine the offset.

It will be noted that the displacement of acquisition may be effected either whilst approaching said stop position or from this stop position.

It is advantageous if the periodic reference signal is sinusoidal and/or cosinusoidal.

The first and/or the second optical grating may be of the transmission, reflection, diffraction, phase or amplitude network type.

In one embodiment, said means generating said reference signal generate both a sinusoidal reference signal and the cosinusoidal reference signal, and said multiplication and summing means form the two corresponding integrated signals, so that said calculating means determine said offset from the arc tangent of the ratio of said integrated signals.

The invention will be more readily understood on reading the following description with reference to the accompanying drawings, in which.

Figure 1:
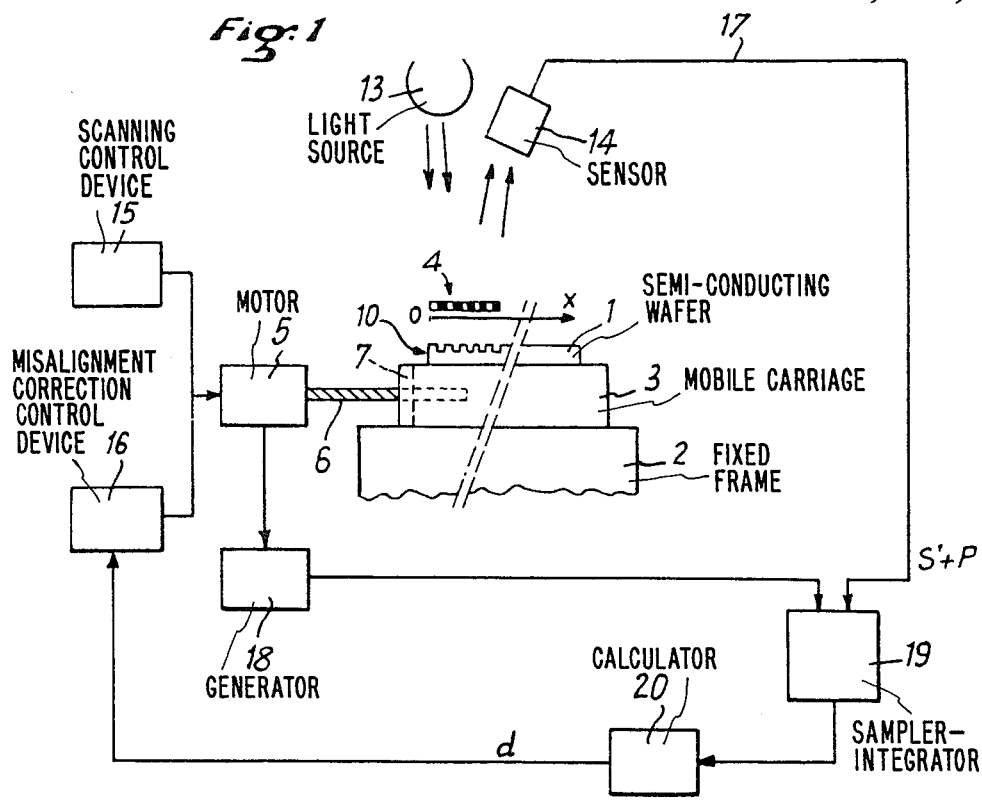
FIG. 1 is a block diagram of the system according to the present invention.

Referring now to the drawings, the system according to the invention, shown schematically in FIG. 1, is intended to precisely align a semi-conducting wafer 1 with respect to a fixed axis OX connected, as well as origin O, to a machine for constructing integrated circuits, of which only a part of the fixed frame 2, a mobile carriage 3 and a fixed optical grating 4 are shown. The carriage 3 may slide parallel to axis OX, under the action of an actuation device comprising, for example, a step-by-step electric motor 5 driving in rotation an endless screw 6 engaged in a nut 7 fast with the carriage 3. This carriage 3 is supported by the fixed frame 2 and is guided in translation by any known means (not shown).

Figure 2:
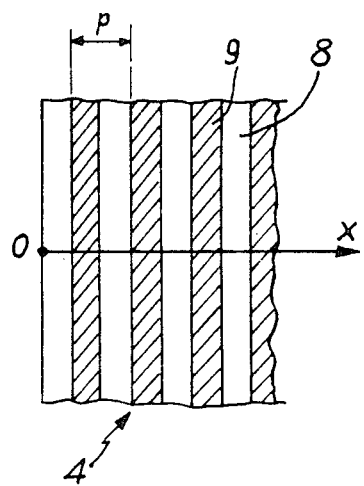
FIGS. 2 and 3 show in plan view the two optical gratings.
Figure 3:
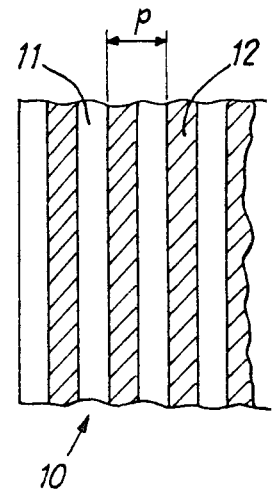

As may be seen in FIG. 2, the optical grating 4 comprises at least transparent bands 8 and opaque bands 9, parallel and alternate, of which the distribution step is equal to p. The transparent bands 8 and the opaque bands 9 are perpendicular to axis OX and, for example, present the same width p/2.

An optical grating 10 is also provided on the semi-conducting wafer 1. This optical grating 10 is for example made by an assembly of ribs 11 and grooves 12, directly engraved in said semi-conducting wafer 1. Due to their difference in level in said wafer, when the latter is illuminated, said ribs 11 are like light lines, whilst grooves 12 behave like dark lines. The ribs 11 and the grooves 12 are parallel and alternate and their distribution step is equal to the step p of distribution of the bands 8 and 9 of the optical grating 4. Their widths are for example equal to one another and therefore equal to p/2.

Moreover, thanks to a positioning device which has not been shown and does not form part of the present invention, the semi-conducting wafer is oriented, and fixed in position, on the carriage 3 so that the ribs 11 and the grooves 12 are perpendicular to axis OX.

When the carriage 3 is taken into a predetermined stop position by means likewise not shown, the gratings 4 and 10 are at least approximately superposed and a light source 13 illuminates the gratings 4 and 10. A photoelectric sensor 14 receives the light returned by the grating 10, after passage through grating 4. In FIG. 1, it has been assumed that this light received by the sensor 14 was the light reflected by the grating 10. It might also be question of diffracted light. Moreover, if the grating 10 were transparent, the light addressed to the sensor 14 might be that traversing the two gratings 4 and 10 consecutively.

The drive means or motor 5 may be controlled either by a scanning control device 15 or by a device 16 for controlling correction of misalignment.

Figure 4A:
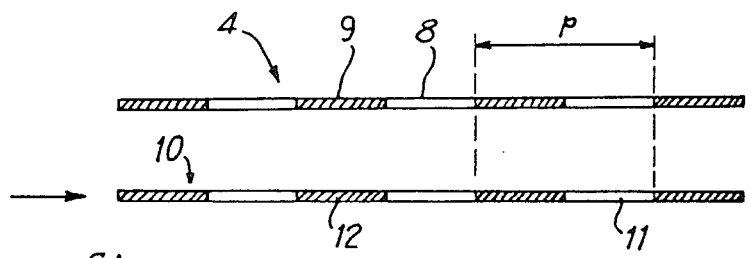
FIGS. 4a to 4f illustrate the process carried out by the invention.

FIG. 4a shows a position of strict alignment of the semi-conducting wafer 1 with respect to the fixed grating 4, when said carriage is in a predetermined stop position. In the case shown, ribs 11 of grating 10 are strictly plumb with the transparent bands 8 of grating 4; similarly, grooves 12 of grating 10 are strictly plumb with opaque bands 9 of grating 4.

Figure 4B:
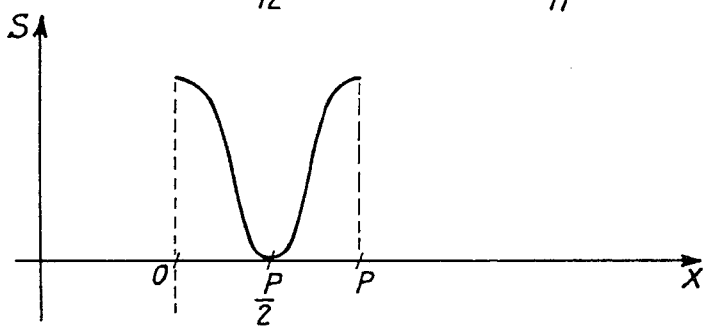

If, from this stop position of the carriage 3 corresponding to the strict alignment shown in FIG. 4a, the control device 15 actuates the motor 5 for the latter to displace the carriage 3, parallel to OX, by a distance equal to kp (with k=1, 2, 3, ...) and if no parasitic light exists, the light received by the sensor 14 varies in sinusoidal manner, due to the advance of the ribs 11 and grooves 12 with respect to the transparent bands 8 and opaque bands 9. Consequently, the electric signal S appearing at the output 17 of the sensor 14 is a sinusoidal function of frequency $$\frac{1}{p},$$

as shown in FIG. 4b.

More precisely, due to the initial position of alignment chosen, the signal S is a function of type $S = S_1$ $$\cos \frac{2\pi}{p} x,$$

expression in which x designates the abscissae along axis OX and $S_1$ is a constant.

Figure 4C:
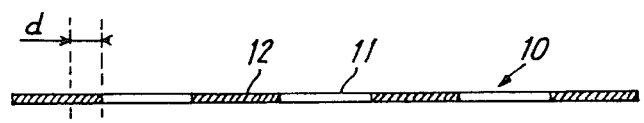
Figure 4D:
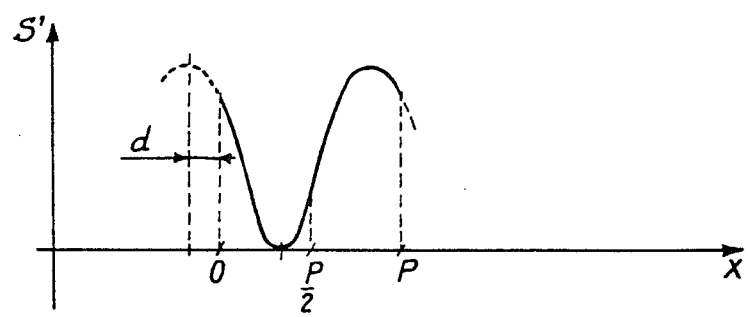

If, as illustrated in FIG. 4c, the grating 10, i.e. the semi-conducting wafer 1, is, in the stop position of the carriage 3, now offset by a distance d towards the right of the Figures with respect to the grating 4 and if the device 15 actuates the motor 5 for the latter to displace the carriage 3 under conditions similar to the preceding ones, it will be readily understood that the signal S' delivered by the photoelectric sensor 14 at its output 17 (assuming that there is no parasitic light), becomes $S' = S_1$ $$\cos \frac{2\pi}{p}$$

(x−d), as shown in FIG. 4b.

Figure 4E:
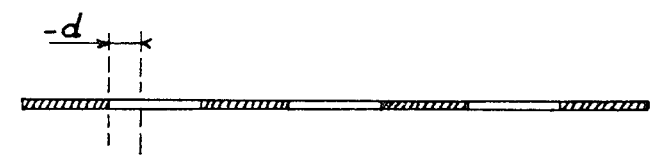
Figure 4F:
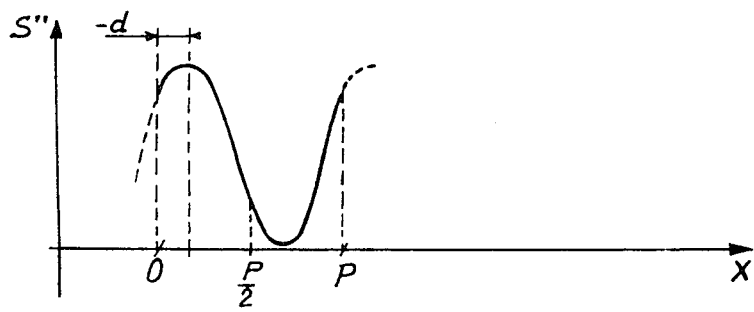

Similarly, if, as illustrated in FIG. 4e, the grating 10 is, in the initial stop position of carriage 3, offset by a distance d towards the left of the Figures, the signal S becomes $S'' = S_1$ $$\cos \frac{2\pi}{p}$$

(x+d), likewise provided that there is no parasitic light.

It is therefore seen that the phase shift of signals S' and S'' (purely periodic) with respect to signal S (likewise purely periodic) is representative of the misalignment of grating 10 with respect to grating 4, in the stop position of the carriage, and therefore this phase shift is representative of the offset of the semi-conducting wafer 1 with respect to its correct position.

It will be noted that, in FIG. 4a, it has been assumed that correct alignment corresponded to the superposition of transparent bands 8 and of opaque bands 9 of grating 4 respectively with light bands 11 and dark bands 12 of grating 10. Consequently, signals S, S' and S'' are sinusoidal functions. It goes without saying that, in this position of correct alignment, transparent bands 8 and opaque bands 9 of grating 4 might be chosen to be respectively superposed with dark bands 12 and light bands 11 of grating 10. Signals S, S' and S'' would then have a cosinusoidal course.

However, because of the surface state of the semiconducting wafer 1 and the presence of gratings 4 and 10, parasitic reflections and diffusions occur, with the result that, in actual fact, it is impossible to obtain purely periodic signals S, S' and S'' and therefore to determine the offset d. The sensor 14 delivers at its output said periodic signals S, S' and S'' on which is superposed a parasitic signal P, which is a function of x. However, it will be noted that, by its very nature, this parasitic signal P has no reason to be periodic, and even less to present the frequency $$\frac{1}{p}$$

of signals S, S' and S''.

The present invention takes advantage of this particularity.

As may be seen in FIG. 1, the system according to the invention further comprises:

a generator 18, synchronized with the displacement of the carriage 3, and delivering the $$\cos \frac{2\pi}{p} x$$

function, or the $$\sin \frac{2\pi}{p} x$$

function, constituting the periodic part of the signal S;

a sampler-integrator 19 receiving the function delivered by the generator 18 and the output signal of the sensor 14; and a calculator 20 receiving the output of the sampler-integrator 19.

The sampler-integrator 19 effects integration over at least one period p of the product of the output signal of the sensor 14 by the function generated by generator 18.

In this way, in the case of an offset d, the sampler-integrator 19 calculates the magnitude:

$$C1 = \int_o^p S' \cos \frac{2\pi}{p} \times dx = \int_o^p S1 \cdot \cos \frac{2\pi}{p} (x-d) \cdot \cos \frac{2\pi}{p} x dx + \int_o^p P \cdot \cos \frac{2\pi}{p} \times dx$$

Since the function P is not periodic, the second term of the above equation is zero. Consequently, the following is obtained:

$$C1 = \int_o^p S1 \cdot \cos \frac{2\pi}{p} (x-d) \cdot \cos \frac{2\pi}{p} x dx = \frac{S1}{2} \cos \frac{2\pi d}{p}$$

From this expression, the calculator 20 calculates the offset d. If generator 18 delivers, in addition, the function $$\sin \frac{2\pi}{p} x$$

and if the sampler-integrator 19 effects in addition the operation $$C2 = \int_o^p S' \sin \frac{2\pi}{p} x dx,$$

this latter expression is equal to $$\frac{S1}{2} \sin \frac{2\pi d}{p}$$

In that case, calculator 20 may calculate d by the expression:

$$d = \frac{p}{2\pi} \arc tg \frac{C2}{C1}$$

Calculator 20 addresses the calculated offset d to device 16 which may correct the stop position of carriage 9 by actuating motor 5.

What is claimed is:

1. A system for strictly positioning, along an axis of an object, such as a wafer of semi-conducting material in the course of a process of constructing integrated circuits, said system comprising:

a carriage mobile in translation along said axis under the action of controlled drive means, said object being fixed to said carriage;

a first optical grating which is fixed, linear and periodic, and perpendicular to said axis;

a second optical grating, fast with said object, likewise linear and periodic, said object being fixed on said carriage so that said second optical grating is perpendicular to said axis and said first and second optical gratings being at least approximately optically aligned, when said carriage occupies a determined stop position;

a light source for illuminating said first and second optical gratings; and a photoelectric sensor for picking up the light coming from said optical gratings, wherein it comprises:

means for controlling the drive means for causing said carriage to make a displacement of acquisition with respect to said stop position, of which the amplitude is at least equal to the step of said second optical grating, then to take said carriage to said stop position;

means for generating, during said displacement of acquisition, a periodic reference signal, of period equal to the step of said second grating, synchronized with the displacement of said carriage, so as to correspond to the pure periodic signal which would be generated by said photoelectric sensor during the displacement of the carriage, if, in said stop position of the latter, said first and second optical gratings are strictly aligned and if no parasitic light is superposed on this periodic signal;

multiplication means for forming, at a plurality of successive instants of said preliminary displacement, the product of the corresponding values of said periodic reference signal and of the signal actually delivered by said photoelectric sensor during this preliminary displacement;

means for summing, over a duration at least equal to the step of said second grating, the signal formed by the succession of said products delivered by said multiplication means;

calculating means for determining, from the integrated signal delivered by said summing means, the possible offset existing between said first and second gratings when the carriage is in its initial position; and means controlling the drive means for causing said carriage to make, from said stop position, a displacement of correction of which the amplitude corresponds to said offset, in order to bring said first and second optical gratings into strict alignment.

2. The system of claim 1, wherein said reference signal is sinusoidal and/or cosinusoidal.

3. The system of claim 1, wherein said means generating said reference signal generate both a sinusoidal reference signal and a cosinusoidal reference signal, and said multiplication and summing means form the two corresponding integrated signals, so that said calculating means determine said offset from the arc tangent of the ratio of said integrated signals.

4. The system of claim 1, wherein said first and/or second optical gratings are of the transmission, reflection or diffraction network type.

5. The system of claim 1, wherein said first and/or second optical gratings are of the phase or amplitude network type.

* * * * *